United States Patent [19]
den Hollander

[11] Patent Number: 5,677,737
[45] Date of Patent: Oct. 14, 1997

[54] VIDEO COMPRESSION FOR WIDE SCREEN TELEVISION

[75] Inventor: Willem den Hollander, Schlieran, Switzerland

[73] Assignee: RCA Thomson Licensing Corporation, Princeton, N.J.

[21] Appl. No.: 578,100

[22] Filed: Dec. 27, 1995

[51] Int. Cl.[6] .................................................. H04N 7/01
[52] U.S. Cl. ........................ 348/445; 348/556; 348/541
[58] Field of Search ............................ 348/445, 540–543, 348/556, 555, 558; H04N 7/01

[56] References Cited

U.S. PATENT DOCUMENTS

| | | | |
|---|---|---|---|
| 4,636,861 | 1/1987 | Willis | 348/541 |
| 5,043,813 | 8/1991 | Christopher | 348/541 |
| 5,166,781 | 11/1992 | Walby et al. | 348/556 |
| 5,170,256 | 12/1992 | Tabata | 348/556 |
| 5,576,769 | 11/1996 | Lendaro | 348/556 |

*Primary Examiner*—Victor R. Kostak
*Attorney, Agent, or Firm*—Joseph S. Tripoli; Joseph J. Laks

[57] ABSTRACT

A first phase locked loop has an oscillator operating at a first frequency and synchronized with a video signal. A counter in the first phase locked loop generates a plurality of timing signals. A second phase locked loop has an oscillator operating at a second frequency, less than the first frequency, and synchronized with a first one of the timing signals. A switch in a controller selects one of the first and second frequencies as an output. A memory for the video signal has a write clock input coupled to the slower oscillator, a read clock input coupled to the switch, and write and read reset inputs coupled respectively to second and third ones of the timing signals. The controller operates the switch responsive to an input signal. An analog to digital converter has a clamp signal input coupled to a fourth one of the timing signals.

19 Claims, 4 Drawing Sheets

VIDEO COMPRESSION FOR WIDE SCREEN TELEVISION

BACKGROUND OF THE INVENTION

1. Field of the Invention

This invention relates to video compression circuits, and in particular, to video compression circuits useful for speeding up video signals from conventional sources for display in wide screen television receivers without image aspect ratio distortion.

2. Description of Related Art

Some wide screen television receivers today are equipped with picture tubes having a wide format display ratio of 16:9. Format display ratio is one kind of aspect ratio relating to the borders or boundaries of a picture. Without additional circuitry, conventional video signals having a format display ratio of 4:3 are displayed on such wide screen television receivers as images that are stretched horizontally. In other words, the image aspect ratio, another kind of aspect ratio related to images within a picture, is distorted.

One solution to prevent such image aspect ratio distortion is to reduce the amplitude of the horizontal deflection current. This can cause problems in convergence correction, as well as other difficulties.

Another solution to prevent such image aspect ratio distortion is to provide time compression of the video signal. Time compression of a video signal is accomplished by storing time discrete values of the video signal into a memory at a sampling rate and reading out from this memory at a second rate faster than the sampling rate. Digital memories are less expensive and more available than analog memories. Therefore the signal is best digitized first by an analog to digital converter; however, only the video must be compressed. The synchronization pulses must remain as they are received. A memory, configured as a first-in-first-out (FIFO) register, for example, is sufficient for the operation. In the prior art, the memory is at least a video memory. The digital samples are continuously clocked into the FIFO. The synchronizing component is read out at normal rate. The clock frequency is increased for reading the video. At the increased clock frequency, more samples would be read out of the FIFO than were written in the FIFO. Stopping the clock for a certain period of time enables the number of output samples to be kept equal to the number of input samples. The output of the FIFO is converted into an analog signal by a digital to analog converter.

In other words, the video signal is speeded up horizontally, so that the resulting 4:3 picture occupies less than all of the available wide screen. A vertical bar appears on the right side if the picture is located at the left side of the screen, at the left side if the picture is at the right of the screen, and on each side of the picture if the picture is centered in the screen. The vertical bars are usually made from non active video information, and are often simply a uniform color or pattern. Video speedup circuits tend to be complicated and costly, particularly where it is desired to control the horizontal position of the 4:3 picture. The generation of properly synchronized and timed read and write clock signals for a video memory can also prove to be troublesome. There is a need for a simple and inexpensive video speedup circuit, which is nevertheless reliable and precise, and can be implemented with readily available components.

SUMMARY OF THE INVENTION

The inventive arrangements taught herein result in a video speedup circuit which meets the need for simplicity, reduced cost and reliability. These inventive arrangements include a novel arrangement of phase locked loops, a minimal video memory requirement, which can be less than one video line length, and the use of a single counter in one of the phase locked loops for generating all of the timing signals needed for controlling the reading and writing of the video memory.

A video speedup circuit, in accordance with an inventive arrangement which satisfies the need for simplicity, low cost and reliability, comprises: a first phase locked loop having a first oscillator operating synchronously with a synchronizing component from a video signal at a first frequency, the first phase locked loop having a counter for generating a plurality of timing signals; a second phase locked loop having a second oscillator operating synchronously with a first one of the plurality of timing signals and at a second frequency less than the first frequency; switch means coupled to the first and second oscillators for selecting one of the first and second frequencies as an output; at least one video memory for the video signal, having a write clock input terminal coupled to the second oscillator, a read clock input terminal coupled to the switch means, and write and read reset input control terminals coupled respectively to second and third ones of the plurality of timing signals; and, control means for operating the switch means.

At least one analog to digital converter has an analog data input for receiving the video signal, a digital data output coupled to the at least one video memory, a first clock input terminal coupled to the second oscillator and a clamp signal input terminal coupled to a fourth one of the plurality of timing signals.

At least one digital to analog converter has a digital data input coupled to the at least one video memory, an analog data output and a second clock input terminal coupled to the switch means.

A decoder has inputs coupled to the counter and respective outputs for generating the read reset signal and the clamp signal.

A video speedup circuit, in accordance with another inventive arrangement which satisfies the need for simplicity, low cost and reliability, comprises: means for separating a synchronizing component from a video signal; a first phase locked loop having an first oscillator operating synchronously with the synchronizing component at a frequency of $nf_H$, where n is an integer and the synchronizing component has a frequency of $f_H$; a second phase locked loop having a second oscillator operating synchronously with an output of the first phase locked loop and at a frequency of $mf_H$, where m is an integer smaller than n; control means coupled to the first and second phase locked loops and responsive to an input control signal, each of the first phase locked loop, the second phase locked loop and the control means generating at least one of a plurality of video memory control signals; and, at least one video memory coupled for receiving the video memory control signals, the video signal being written into the memory synchronously with the synchronizing component and at the $mf_H$ frequency and being read from the memory synchronously with the synchronizing component and at one of the $nf_H$ and the $mf_H$ frequencies as selected by the control means, the video signal being speeded up by a factor of $$\frac{n}{m}$$

when the $nf_H$ frequency is selected.

The first and second phase locked loops may comprise: a first divider in the first phase locked loop having a plurality of stages for generating a plurality of timing signals, a first one of the timing signals having a frequency of $$\frac{n}{a} f_H$$

and a second one of the timing signals having a frequency of $$\frac{n}{a*b} f_H,$$

where a and b are integers and a*b=n; a first phase detector in the first phase locked loop responsive to the synchronizing component from the video signal and responsive to the second one of the timing signals having the frequency of $$\frac{n}{a*b} f_H;$$

a second divider in the second phase locked loop having an output frequency of $$\frac{m}{c} f_H,$$

where c is an integer and $$\frac{m}{c} = \frac{n}{a};$$

and, a second phase detector in the second phase locked loop responsive to the first one of the timing signals having the frequency of $$\frac{n}{a} f_H$$

and responsive to the second divider.

The control means may comprise a decoder for the timing signal and switch means. The switch means may provide: a first operating mode in which the $nf_H$ frequency is selected; a second operating mode in which the $mf_H$ frequency is selected; and, a third operating mode in which neither of the $nf_H$ and the $mf_H$ frequencies is selected. The third mode can be utilized to control the horizontal position of the 4:3 picture.

The video memory may be a digital first-in-first-out (FIFO) video memory. Accordingly, the circuit may further comprise: at least one analog to digital converter for digitizing the video signal prior to being written into the memory, the analog to digital converter being clocked synchronously with the synchronizing component and at the $mf_H$ frequency; and, at least one digital to analog converter for video data read from the memory, the digital to analog converter being clocked synchronously with the synchronizing component and at the one of the $nf_H$ and the $mf_H$ frequencies selected by the switch means.

In a presently preferred embodiment, the oscillator of the first phase locked loop operates at 18 MHz and the oscillator of the second phase locked loop operates at 13.5 MHz. In this embodiment: n=1152; m=864; a=4; b=288; and, c=3. Accordingly:

$$\frac{n}{m} = \frac{4}{3} \; ; \text{and,} \; \frac{n}{a} = \frac{m}{c} = 288.$$

The input control signal may be a simple and direct user generated command. Alternatively, the input control signal may be generated by an automatic detection circuit which identifies the format display ratio of the input video signal, alone or in conjunction with a microprocessor. Such a microprocessor may control other aspects of the video display, for example the position of the 4:3 picture and multiple picture displays.

In accordance with a further inventive arrangement, the first phase locked loop, which generates the read clock signal for speeding up the video, is synchronized directly with the synchronizing component of the input video signal; whereas the second phase locked loop, which generates the write control clock signal under all is circumstances, and the read clock signal when no video speedup is desired, is synchronized with the synchronizing component of the input video signal indirectly, by an intermediate timing signal generated by the first phase locked loop. Operation of the switch is synchronized with the synchronizing component of the input video signal to provide a smooth transition between the operating modes.

DETAILED DESCRIPTION OF THE PREFERRED EMBODIMENTS

A time compression ratio of 4:3, which corresponds to a 4:3 video speedup, is required for displaying a video signal from a 4:3 format display ratio source on a wide screen having a format display ratio of 16:9. The write and read clock frequencies must have a ratio of 3:4. When 13.5 MHz is selected for the sampling frequency of the incoming video, the other frequency for reading the video samples must be 18 MHz. Each of the clock generators for these frequencies must be locked to the horizontal frequency of the input video signal being speeded up.

Figure 1:
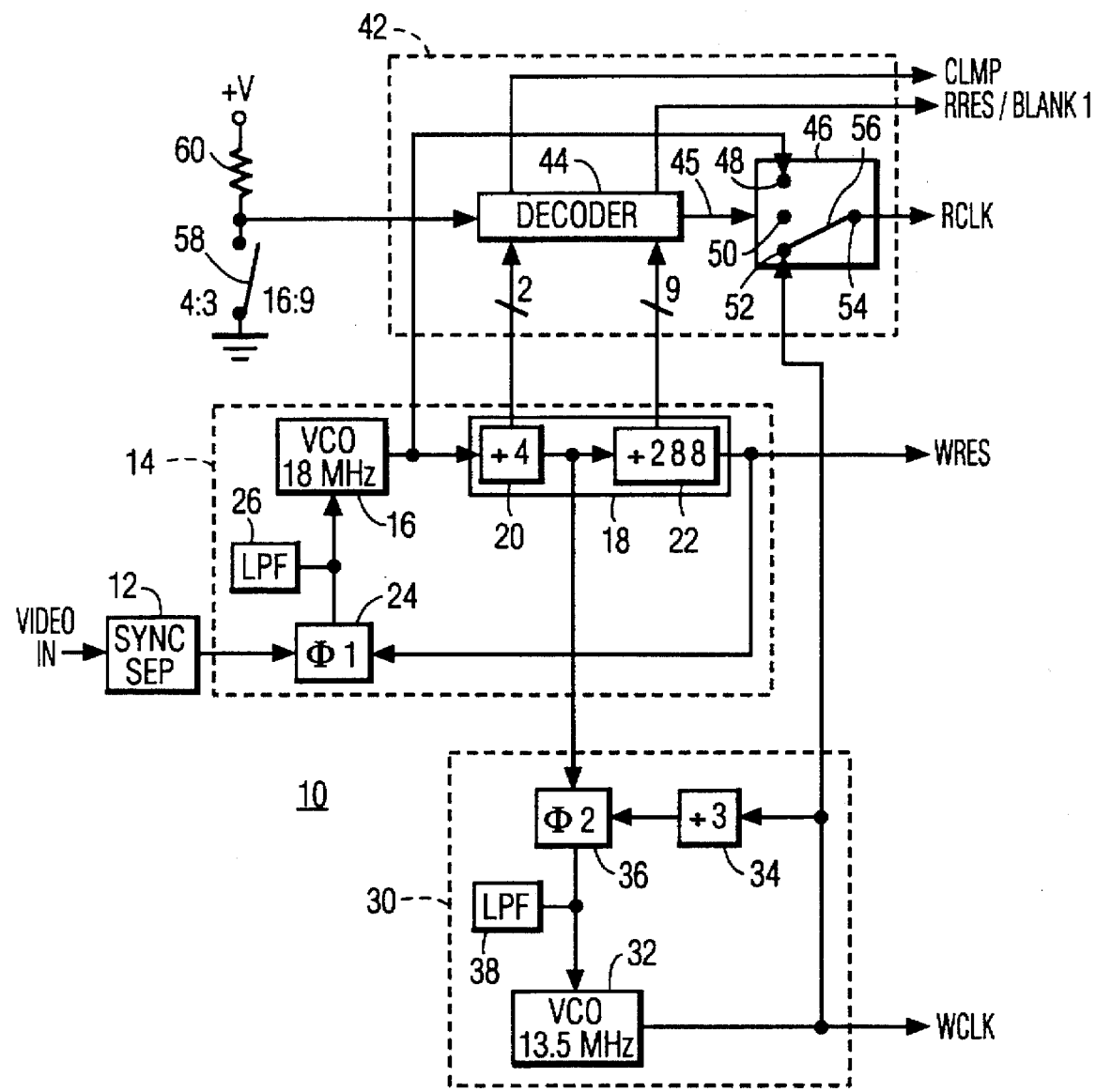
FIG. 1 is a block diagram of control logic for a video speedup circuit in accordance with an inventive arrangement.

It has been found very advantageous to use a first phase locked loop (PLL) for the 18 MHz clock, which is locked to the horizontal synchronizing component of the input video signal, and a second phase locked loop for the 13.5 MHz clock, which is locked to the 18 MHz clock. Control logic 10 incorporating such an advantageous arrangement of phase locked loops is shown in block diagram form in FIG. 1. The control logic generates all of the signals which are necessary to control analog to digital (A/D) converters, video memories and digital to analog (D/A) converters for implementing the video speedup.

Figure 4:
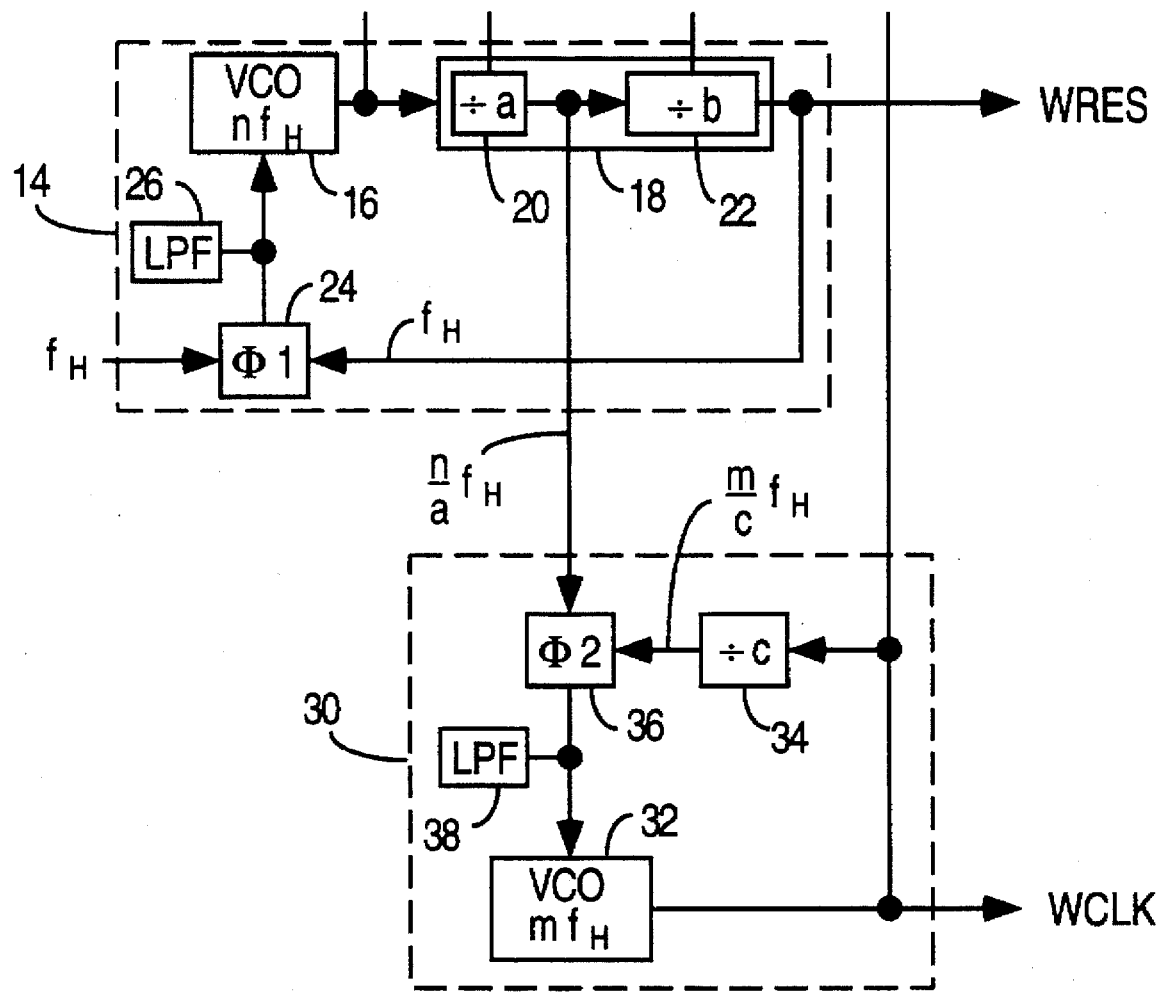
FIG. 4 is a block diagram useful for explaining the operation of the phase locked loops shown in FIG. 1.

An input video signal (VIDEO IN) is supplied to a horizontal synchronizing signal separator 12. A horizontal synchronizing component, having a frequency designated $f_H$, is an input to a first phase locked loop 14. The phase locked loops are also shown in FIG. 4, in order to demonstrate the operating frequencies and timing signals derived therefrom as multiples of $f_H$. The $f_H$ synchronizing component is one input to a first phase detector (Φ1) 24. Phase locked loop 14 has a voltage controlled oscillator 16 having a nominal frequency of 18 MHz. This frequency can be expressed as $nf_H$, where n=1152. The $nf_H$ output of the oscillator 16 is an input to an 11-bit counter 18, having first and second sets of as divider stages 20 and 22. The first set of divider stages 20 divide the $nf_H$ signal by a factor a $$\left(\frac{n}{a} f_H\right).$$

The second set of divider stages 22 divide the $$\frac{n}{a*b} f_H.$$

signal by a factor b, that is, $$\frac{n}{a} f_H$$

The outputs of the divider stages of the first set 20 represent the lower two bits of an of the 11-bit counter. In the illustrated embodiment, factor a=4. The outputs of the divider stages of the second set 22 represent the upper nine bits of the 11-bit counter. In the illustrated embodiment, factor b=288. In the illustrated embodiment, 4*288=1152. Since a*b=n, $$\frac{n}{a*b} f_H$$

must equal $f_H$. Therefore, the output of counter 18 is appropriately timed as the other input to phase detector 24. The output of phase detector 24 is integrated in a low pass filter (LPF) 26 to develop a frequency control voltage for oscillator 16.

The $$\frac{n}{a} f_H$$

signal is an input to a second phase locked loop 30. The $$\frac{n}{a} f_H$$

signal is one input to a second phase detector (Φ2) 36. Phase locked loop 30 has a voltage controlled oscillator 32 having a nominal frequency of 13.5 MHz. This frequency can be expressed as $mf_H$, where m=864. The $mf_H$ output of the oscillator 16 is an input to a counter 34, which divides the $mf_H$ signal by a factor c, that is, $$\frac{m}{c} f_H.$$

In the illustrated embodiment, factor c=3. Since $$\frac{m}{c} = \frac{n}{a} = 288,$$

the output of counter 34 is appropriately timed as the other input to phase detector 36. The output of phase detector 36 is integrated in a low pass filter (LPF) 38 to develop a frequency control voltage for oscillator 32.

A control means 42 includes a decoder 44 and a switch 46. The decoder 44 is responsive to the outputs of the divider stages of counter 18 in phase locked loop 14. The decoder is also responsive to an input control signal from a source 58. Source 58 is illustrated as a simple switch, coupled in series between ground and a pull up resistor 60, the resistor 60 also being coupled to a voltage source +v. The input control signal may be a simple and direct user generated command, in which case source 58 may represent a remote control button. Alternatively, source 58 may represent an automatic detection circuit, which identifies the format display ratio of the input video signal alone, or such a detector in conjunction with a microprocessor. Such a microprocessor may control other aspects of the video display, for example the position of the 4:3 picture and multiple picture displays.

Switch 46 has three inputs and one output. Input terminal 48 is the 18 MHz output of oscillator 16, input terminal 52 is the 13.5 MHz output of oscillator 32 and input terminal 50 is open, having no signal at all. Decoder 44 generates a switch control signal 45, which determines which of the three inputs is coupled to output terminal 54. The switch provides three operating modes: a first operating mode in which the $nf_H$ (18 MHz) frequency is selected as an output; a second operating mode in which the $mf_H$ (13.3 MHz) frequency is selected as an output; and, a third operating mode in which neither of the $nf_H$ and the $mf_H$ frequencies, and in fact no signal at all, is selected as an output.

It is particularly advantageous that the counter 18 provides all of the timing signals needed for controlling the video speedup, including read and write reset signals for the video memory, a clamp signal for the analog to digital converters and the synchronizing signal for the second phase locked loop.

Figure 3:
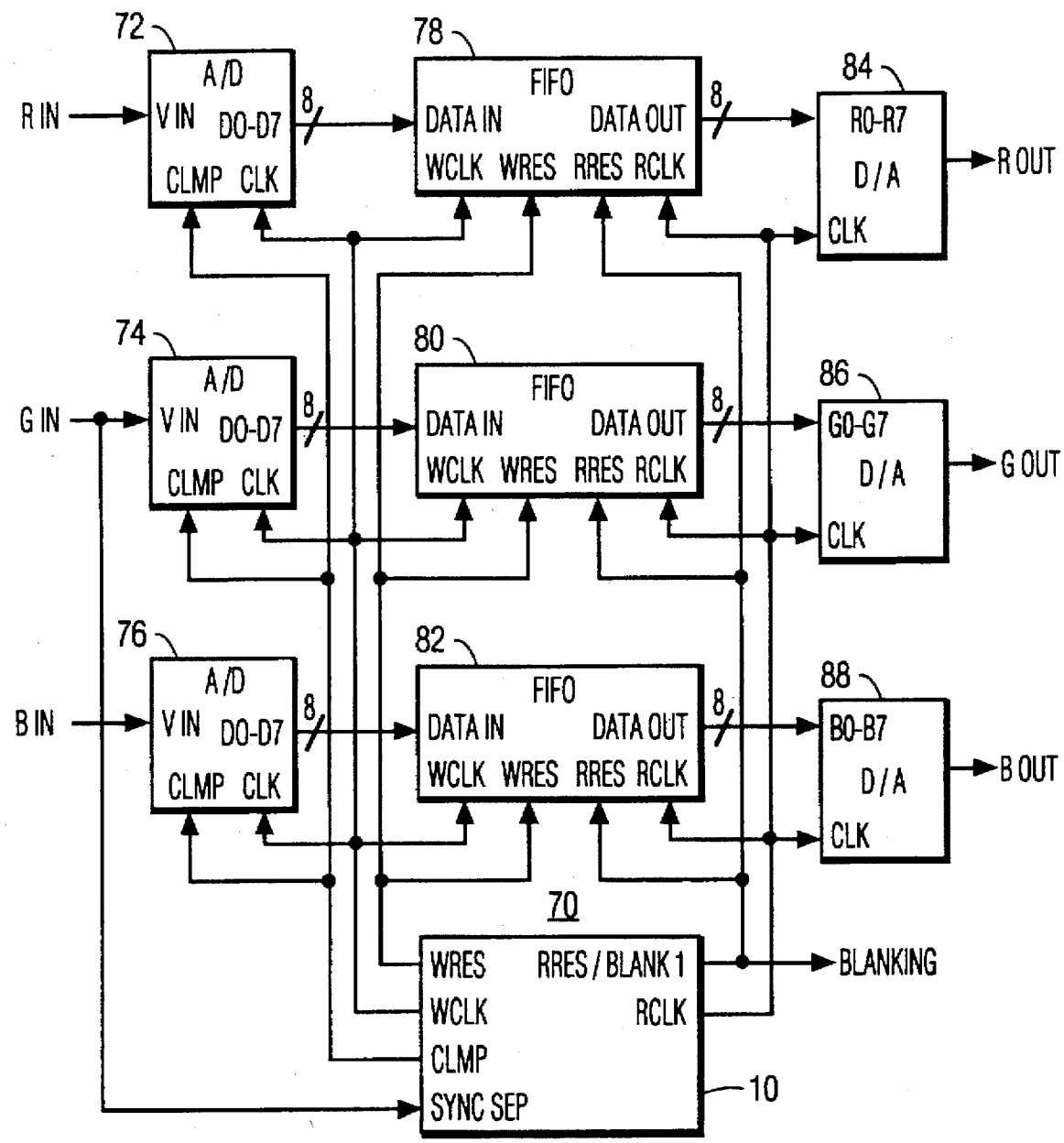
FIG. 3 is a block diagram of the video signal processing circuitry controlled by the logic shown in FIG. 1.

A video processor 70 shown in block diagram form in FIG. 3 is responsive to the control and clock/timing signals generated by control logic 10. The input video signal is illustrated in R G B format. The R, G and B signals (denoted R IN, G IN, and B IN) are inputs to analog to digital converters 72, 74 and 76 respectively. The is synchronizing component is present on the G IN signal, which is also an input to the control logic 10. The outputs of the analog to digital converters 72, 74 and 76 are inputs to first-in-first-out (FIFO) video memories 78, 80 and 82 respectively. Video memories 78, 80 and 82 can be shorter in length than a full video of video. In an embodiment where a 4:3 picture will be centered in a 16:9 wide screen display, for example, the delay which the memory needs to provide is only enough to shift the left side of the picture from the left edge of the display, toward the right edge of the display, by approximately $$\frac{2}{9}$$

of a video length. The delay corresponds to the time during which data is written into the memory but not read from the memory. The outputs of memories 78, 80 and 82 are inputs to analog to digital converters 84, 86 and 88 respectively. The outputs of digital to analog converters 84, 86 and 88 are the R G B output signals, denoted R OUT, G OUT, and B OUT respectively.

Appropriate filters which can be connected at the analog inputs and outputs of the converters have been omitted for purposes of clarity.

Alternatively, further savings can be achieved in the number of components by using Y, U and V component signals; and multiplexing the U and V components in the same video memory.

The sampling clock for the analog to digital converters 72, 74 and 76 is the same signal as the write clock (WCLK) for the video memories 78, 80 and 82. The sampling clock for the digital to analog converters is the same signal as the read clock (RCLK) for the video memories 78, 80 and 82.

The write clock signal is the output of the 13.5 MHz oscillator 32. The read clock is the output of switch 46, which may be the output of the 18 MHz oscillator 16, the output of the 13.5 MHz oscillator 32, or no signal at all.

Figure 2:
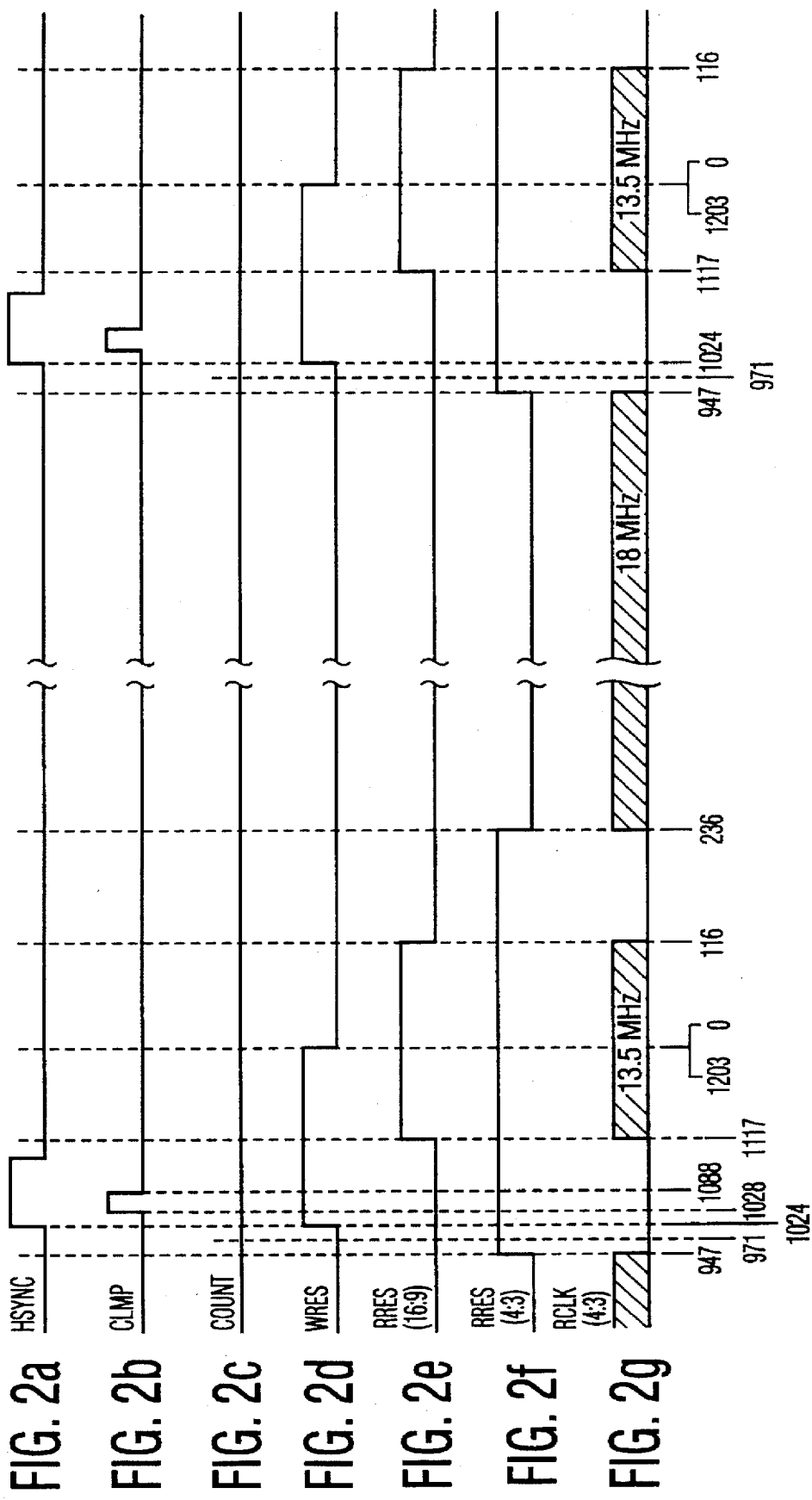
FIGS. 2a–2g are waveforms useful for explaining the operation of the control logic in FIG. 1.

FIGS. 2a–2g illustrate the timing of all of the output waveforms of logic circuit 10, together with the horizontal synchronizing component, shown as HSYNC in FIG. 2a, and the count of counter 18. All signals are referenced to the output of the first and second sets of the dividers 20 and 22 of counter 18 which, as noted, represent respectively the lower and higher bits of the 11-bit counter. Counter 18 counts from 0 to 971 and from 1024 to 1203, shown as COUNT in FIG. 2c. The value of COUNT is 1024 at the beginning of HSYNC. The signal CLMP shown in FIG. 2b, which can be used by the analog to digital converters to clamp the video input signal to ground, is active between COUNT 1028 and 1088.

The video memories 78, 80 and 82 used as FIFO's consist of a series of memory locations. Two address pointers, one pointing to the location to be written, the other pointing to the location to be read, are incremented and reset respectively by separate clock and reset signals. Write clock WCLK is the 13.5 MHz clock coming directly from the oscillator 32. It remains the same during the non-compressed and the compressed modes. The most significant bit of the counter is designated WRES and shown in FIG. 2d. WRES serves two purposes. The positive going edge is used for phase comparison and coincides with the leading edge of HSYNC. The negative going edge resets the write address pointer of the video memories at the start of the video for each video. This happens at COUNT zero. The last video sample of the video is written at count 947.

When the video is compressed, the memory locations are read out with the read clock (RCLK), shown in FIG. 2g, being 18 MHz. This occurs from COUNT 236 to COUNT 947. The last location is read immediately after it has been written. This is the reason that reading the memory cannot start earlier. In the compressed mode, the clock must be stopped for a certain time to prevent more samples being read out than were written in for each video. If the read clock is stopped for equal periods of time before and after reading the memory, the resulting 4:3 picture will be centered between the horizontal sync pulses and, as a result, appear centered on the television receiver's wide screen. The rest of the video, including the synchronizing and blanking period, is read with an RCLK of 13.5 MHz. At the beginning of the compressed video the read pointer must be reset. The read reset signal (RRES), as shown in FIG. 2d, therefore goes low after COUNT 236. RRES goes high at the end of the video, after COUNT 947. In this manner, RRES can be used as a blanking signal as well.

During non compressed operation the RCLK is continuously 13.5 MHz. The synchronizing component should have the same timing as is during the compressed operation. In the non compressed mode RRES, as shown in FIG. 2e, has to go low at COUNT 116 and high at COUNT 1117. As a result, the horizontal synchronizing component is delayed in phase relative to the incoming signal HSYNC. When the horizontal synchronization signals for the display are taken from the output of the digital to analog converters, no further measures have to be taken.

The switch 46 allows for switching from the regular mode to the compressed mode. The switching is synchronized to the horizontal synchronizing component to provide a smooth transition between modes.

The video compression circuit taught herein may be implemented with relatively inexpensive, commercially available integrated circuits which minimize the need for external discrete components. The synchronizing signal separator 12 may be embodied in an industry type EL4583. The first phase detector 24 and 18 MHz oscillator 16 may be embodied in an industry type EL4584. The second phase detector 32 and the 13.5 MHz oscillator 28 may be embodied in an industry type 74HCT4046. The counter 18, the divider 34, the decoder 44 and the switch 46 may be embodied in a programmable logic device, such as industry type EPM5016. Each of the analog to digital converters may be embodied in an industry type BT208. Each of the video memories may be embodied in an industry type HM63021. The digital to analog converters may be embodied in a triple converter, such as an industry type BT101.

What is claimed is:

1. A circuit, comprising:
   a first phase locked loop having a first oscillator operating synchronously with a synchronizing component from a video signal at a first frequency, said first phase locked loop having a counter for generating a plurality of timing signals;
   a second phase locked loop having a second oscillator operating synchronously with a first one of said plurality of timing signals and at a second frequency less than said first frequency;
   control means coupled to said first and second oscillators for selecting one of said first and second frequencies as an output; and,
   at least one memory for said video signal, having a write clock input coupled to said second oscillator, a read clock input coupled to said control means, and write and read reset inputs coupled respectively to second and third ones of said plurality of timing signals.

2. The circuit of claim 1, further comprising at least one analog to digital converter for said video signal coupled to said at least one memory, said analog to digital converter having a first clock input coupled to said second oscillator and a clamp signal input coupled to a fourth one of said plurality of timing signals.

3. The circuit of claim 2, further comprising at least one digital to analog converter, having a digital data input coupled to said at least one video memory, an analog data output and a second clock input coupled to said control means.

4. The circuit of claim 2, wherein said control means comprises a decoder responsive to said counter for generating said third and fourth ones of said plurality of timing signals.

5. The circuit of claim 1, further comprising a decoder responsive to said counter for generating said third one of said plurality of timing signals.

6. A circuit, comprising:
   means for separating a synchronizing component from a video signal;
   a first phase locked loop having an first oscillator operating synchronously with said synchronizing component at a frequency of $nf_H$, where n is an integer and said synchronizing component has a frequency of $f_H$;
   a second phase locked loop having a second oscillator operating synchronously with an output of said first phase locked loop and at a frequency of $mf_H$, where m is an integer smaller than n;
   control means coupled to said first and second phase locked loops and responsive to an input control signal, each of said first phase locked loop, said second phase locked loop and said control means generating at least one of a plurality of video memory control signals; and, at least one video memory coupled for receiving said video memory control signals, said video signal being written into said memory synchronously with said synchronizing component and at said $mf_H$ frequency and being read from said memory synchronously with said synchronizing component and at one of said $nf_H$ and $mf_H$ frequencies as selected by said control means, said video signal being speeded up by a factor of $$\frac{n}{m}$$

when said $nf_H$ frequency is selected.

7. The circuit of claim 6, wherein said first phase locked loop comprises a first divider having a plurality of stages for generating a plurality of timing signals, a first one of said timing signals having a frequency of $$\frac{n}{a} f_H$$

and a second one of said timing signals having a frequency of $$\frac{n}{a*b} f_H,$$

where a and b are integers and a*b=n.

8. The circuit of claim 7, wherein said second phase locked loop comprises a second divider having an output frequency of $$\frac{m}{c} f_H,$$

where c is an integer and $$\frac{m}{c} = \frac{n}{a}.$$

9. The circuit of claim 7, wherein said second phase locked loop comprises a phase detector responsive to said first one of said timing signals having said frequency of $$\frac{n}{a} f_H.$$

10. The circuit of claim 7, wherein said second phase locked loop comprises:

a second divider having an output frequency of $$\frac{m}{c} f_H,$$

where c is an integer and $$\frac{m}{c} = \frac{n}{a};$$

and, a phase detector responsive to said first one of said timing signals having said frequency of $$\frac{n}{a} f_H$$

and to said second divider.

11. The circuit of claim 7, wherein said first phase locked loop comprises a phase detector responsive to said synchronizing component from said video signal and to said second one of said timing signals having a frequency of $$\frac{n}{a*b} f_H.$$

12. The circuit of claim 6, wherein said first and second phase locked loops comprise:

a first divider in said first phase locked loop having a plurality of stages for generating a plurality of timing signals, a first one of said timing signals having a frequency of $$\frac{n}{a} f_H$$

and a second one of said timing signals having a frequency of $$\frac{n}{a*b} f_H,$$

where a and b are integers and a*b=n;

a first phase detector in said first phase locked loop responsive to said synchronizing component from said video signal and responsive to said second one of said timing signals having said frequency of $$\frac{n}{a*b} f_H;$$

a second divider in said second phase locked loop having an output frequency of $$\frac{m}{c} f_H,$$

where c is an integer and $$\frac{m}{c} = \frac{n}{a};$$

and, a second phase detector in said second phase locked loop responsive to said first one of said timing signals having said frequency of $$\frac{n}{a} f_H$$

and responsive to said second divider.

13. The circuit of claim 12, wherein said control means comprises switch means, said switch means having:

a first operating mode in which said $nf_H$ frequency is selected;

a second operating mode in which said $mf_H$ frequency is selected; and, a third operating mode in which neither of said $nf_H$ and said $mf_H$ frequencies is selected.

14. The circuit of claim 6, wherein said control means comprises switch means, said switch means having:
- a first operating mode in which said $nf_H$ frequency is selected;
- a second operating mode in which said $mf_H$ frequency is selected; and,
- a third operating mode in which neither of said $nf_H$ and said $mf_H$ frequencies is selected.

15. The circuit of claim 6, comprising:
- at least one analog to digital converter for digitizing said video signal prior to being written into said memory, said analog to digital converter being clocked synchronously with said synchronizing component and at said $mf_H$ frequency; and,
- at least one digital to analog converter for video data read from said memory, said digital to analog converter being clocked synchronously with said synchronizing component and at said one of said $nf_H$ and said $mf_H$ frequencies selected by said switch means.

16. The circuit of claim 10, wherein:

$$\frac{n}{a} = \frac{m}{c} = b.$$

17. The circuit of claim 12, wherein:

$$\frac{n}{a} = \frac{m}{c} = b.$$

18. The circuit of claim 6, wherein said control means comprises:
- a decoder responsive to a plurality of timing signals generated by said first phase locked loop, said decoder generating at least one of said plurality of video memory control signals; and,
- switch means having inputs coupled said first and second oscillators and an output for supplying a read clock signal for said memory.

19. The circuit of claim 18, wherein said first phase locked loop comprises a multiple stage counter for generating said plurality of timing signals, one of said timing signals being supplied as said output for synchronizing said second phase locked loop.

* * * * *